(12) United States Patent
Kato

(10) Patent No.: US 7,981,780 B2
(45) Date of Patent: Jul. 19, 2011

(54) METHOD AND APPARATUS FOR PROCESSING SEMICONDUCTOR WAFER AFTER IMPURITY IMPLANTATION

(75) Inventor: Shinichi Kato, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 106 days.

(21) Appl. No.: 12/404,434

(22) Filed: Mar. 16, 2009

(65) Prior Publication Data
US 2009/0275212 A1 Nov. 5, 2009

(30) Foreign Application Priority Data
May 2, 2008 (JP) ................................. 2008-120411

(51) Int. Cl.
*H01L 21/00* (2006.01)
(52) U.S. Cl. ........................................ 438/522; 257/288
(58) Field of Classification Search ................... 438/522
See application file for complete search history.

(56) References Cited

U.S. PATENT DOCUMENTS

| | | | | |
|---|---|---|---|---|
| 4,772,489 A | * | 9/1988 | Shikata .......................... | 438/779 |
| 5,514,885 A | * | 5/1996 | Myrick .......................... | 257/216 |
| 6,492,215 B1 | * | 12/2002 | Kishi ............................. | 438/197 |
| 6,610,142 B1 | * | 8/2003 | Takayama et al. ............... | 117/8 |
| 6,933,181 B2 | * | 8/2005 | Inoue et al. ..................... | 438/149 |
| 6,953,728 B2 | * | 10/2005 | Murakami et al. .............. | 438/275 |
| 7,026,205 B2 | * | 4/2006 | Ito et al. ........................ | 438/199 |
| 7,041,939 B2 | * | 5/2006 | Hosokawa ...................... | 219/390 |
| 7,306,985 B2 | * | 12/2007 | Sasaki et al. ................... | 438/216 |
| 7,323,368 B2 | * | 1/2008 | Takayama et al. ............. | 438/149 |
| 7,501,332 B2 | * | 3/2009 | Ito et al. ......................... | 438/528 |
| 2006/0291835 A1 | | 12/2006 | Nozaki et al. .................. | 392/416 |
| 2007/0087492 A1 | * | 4/2007 | Yamanaka ..................... | 438/166 |
| 2008/0296578 A1 | * | 12/2008 | Yamazaki et al. .............. | 257/59 |
| 2009/0263112 A1 | * | 10/2009 | Kiyama et al. ................. | 392/418 |

FOREIGN PATENT DOCUMENTS

JP 2007-005532 1/2007

OTHER PUBLICATIONS

Ghandhi S. K., VLSI Fabrication Principles: Silicon and Gallium Arsenide 2nd Edition, Wiley-Interscience, pp. 639-642, 1994.*

* cited by examiner

*Primary Examiner* — Jarrett J Stark
*Assistant Examiner* — Nicholas Tobergte
(74) *Attorney, Agent, or Firm* — Ostrolenk Faber LLP

(57) ABSTRACT

A semiconductor wafer implanted with impurities is loaded into a chamber. After oxygen gas is introduced around the semiconductor wafer, the semiconductor wafer is irradiated with a flash of light from flash lamps for an irradiation time not shorter than 0.1 milliseconds and not longer than 100 milliseconds, to thereby momentarily raise the surface temperature of the semiconductor wafer up to not lower than 800° C. and not higher than 1300° C. Since the temperature rises in an extremely short time, it is possible to activate the impurities while suppressing thermal diffusion thereof. Further, since an extremely thin oxide film is formed on a surface of the semiconductor wafer, this film serves as a protection film in a subsequent cleaning process, to prevent removal of the impurities.

10 Claims, 11 Drawing Sheets

F I G . 1
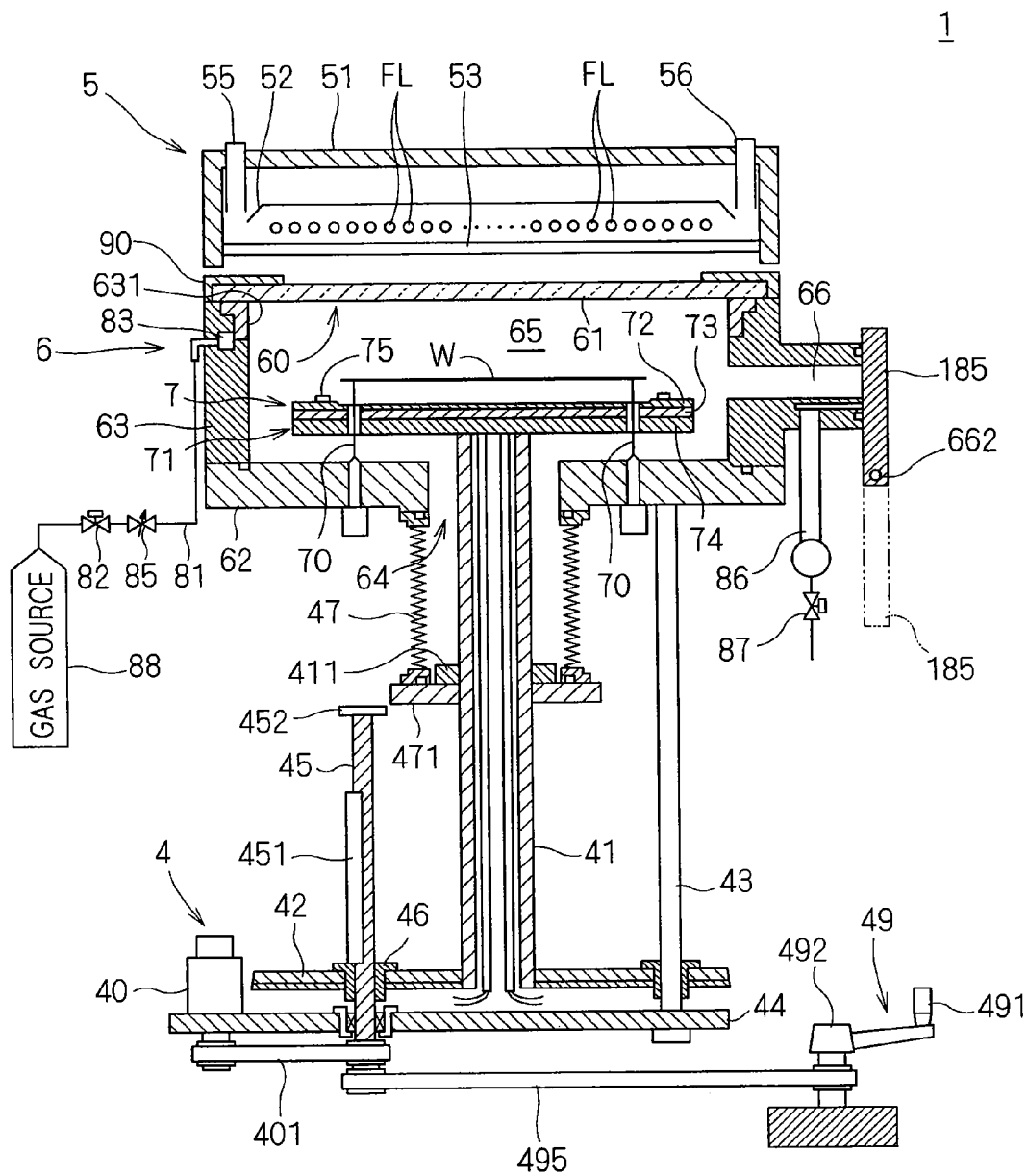

F I G . 4
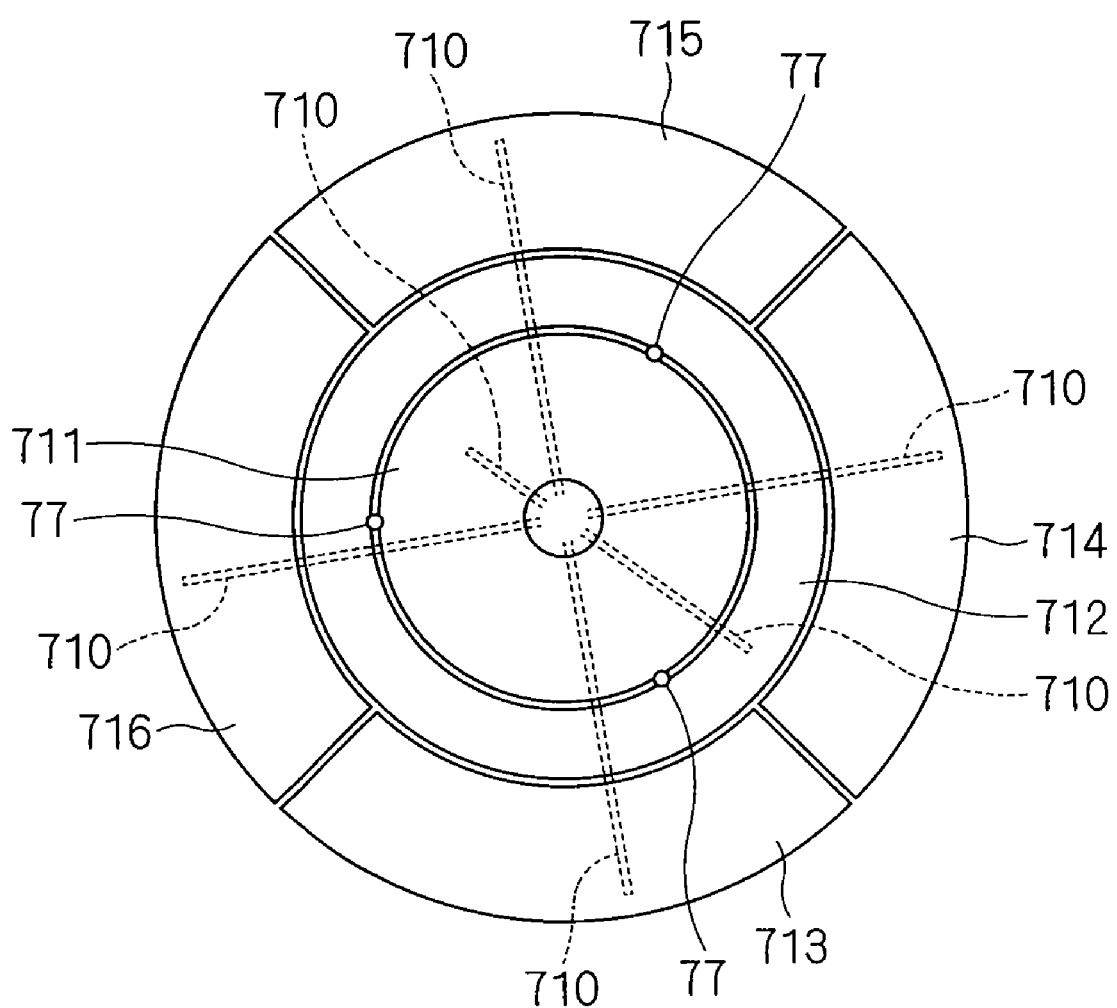

F I G . 9
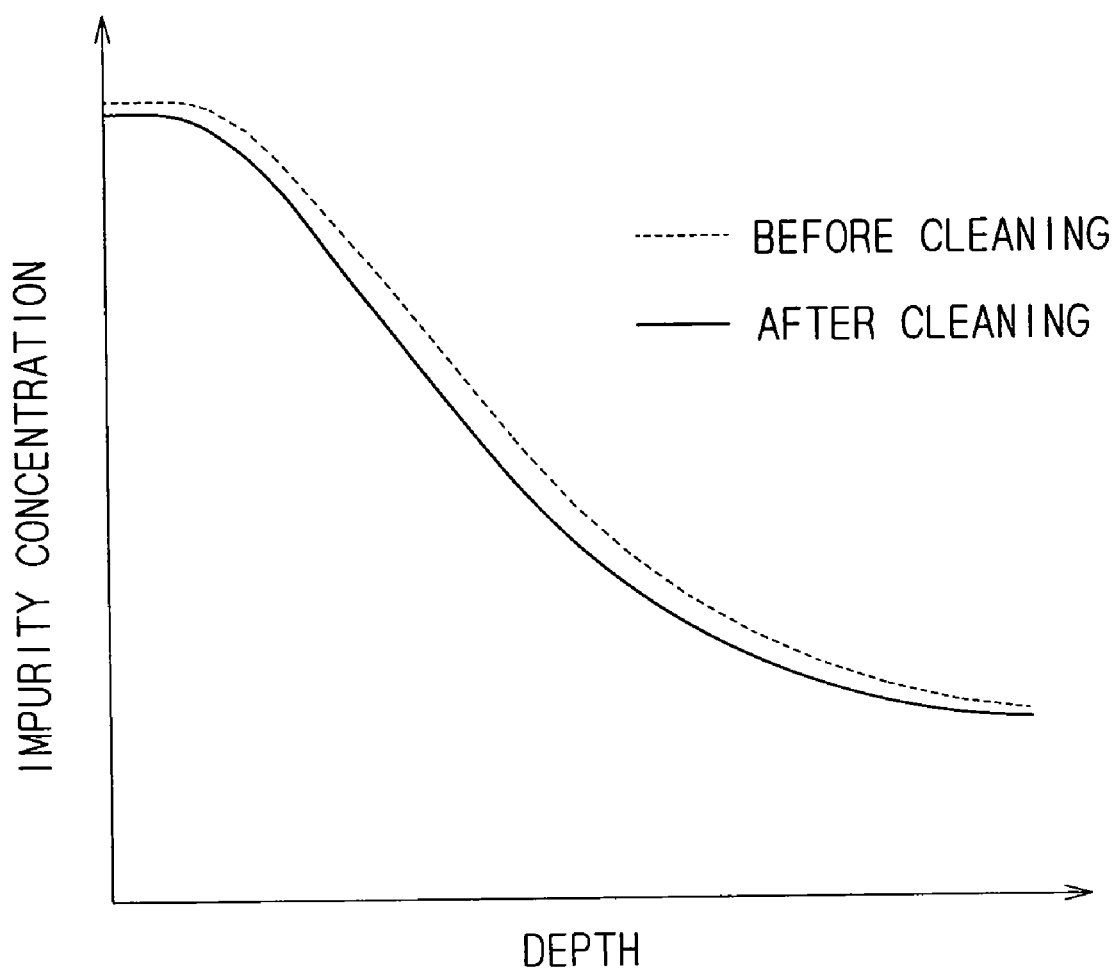

METHOD AND APPARATUS FOR PROCESSING SEMICONDUCTOR WAFER AFTER IMPURITY IMPLANTATION

BACKGROUND OF THE INVENTION

1. Field of the Invention

The present invention relates to a substrate processing method and a substrate processing apparatus for performing a heat treatment on a semiconductor substrate implanted with impurities by light irradiation.

2. Description of the Background Art

Conventionally, a lamp annealer employing a halogen lamp has been typically used in the step of activating impurities in a semiconductor wafer after impurity (ion) implantation. Such a lamp annealer carries out the activation of impurities in the semiconductor wafer by heating (or annealing) the semiconductor wafer up to a temperature of, e.g., about 1000° C. to 1100° C. Such a heat treatment apparatus utilizes the energy of light emitted from the halogen lamp to raise the temperature of the substrate at a rate of about hundreds of degrees per second.

On the other hand, in recent years, with the increasing degree of integration of semiconductor devices, it has been desired to provide a shallower junction as the gate length decreases. It has turned out, however, that even the execution of the process of activating impurities in a semiconductor wafer by the use of the above-mentioned lamp annealer which raises the temperature of the semiconductor wafer at a rate of about hundreds of degrees per second produces a phenomenon in which the impurities of boron, phosphorus and the like implanted in the semiconductor wafer are diffused deeply by heat. The occurrence of such a phenomenon causes the depth of the junction to exceed a required level, giving rise to apprehension about a hindrance to good device formation.

To solve this problem, for example, US 2006/0291835 proposes a technique for irradiating a surface of a semiconductor wafer with flash light by using a xenon flash lamp (hereinafter, even when referred to simply as a "flash lamp", it refers to a xenon flash lamp) to raise the temperature of only the surface of the semiconductor wafer, which is implanted with impurities, in an extremely short time (several milliseconds or less). The xenon flash lamp has a spectral distribution of radiation ranging from ultraviolet to near-infrared regions. The wavelength of light emitted from the xenon flash lamp is shorter than that of light emitted from the conventional halogen lamp, and almost coincides with a fundamental absorption band of a silicon semiconductor wafer. It is therefore possible to quickly raise the temperature of the semiconductor wafer, with a small amount of light transmitted through the semiconductor wafer, when the semiconductor wafer is irradiated with flash light emitted from the xenon flash lamp. Also, it has turned out that the flash light irradiation in an extremely short time of several milliseconds or less can selectively raise the temperature of only near the surface of the semiconductor wafer. Therefore, the temperature rise in an extremely short time by using the xenon flash lamp allows the execution of only the impurity activation without deep diffusion of the impurities.

After such a process of activating impurities as discussed above, usually, a front surface cleaning process is performed on the semiconductor wafer in order to remove a resist film or the like. For a shallower junction, however, impurities are implanted only into a topmost surface layer of the semiconductor wafer. Therefore, in the front surface cleaning process, the layer implanted with impurities is removed from the semiconductor wafer.

FIG. 11 is a graph showing impurity concentration distributions in the vicinity of a surface of a semiconductor wafer before and after cleaning in the background art. In this figure, the horizontal axis represents the depth from the surface of the semiconductor wafer and the vertical axis represents the impurity concentration. As shown in FIG. 11, a large amount of impurities are removed from the surface layer of the semiconductor wafer by the front surface cleaning process and few impurities remain after cleaning. Thus, there arises a problem that it can not serve as a semiconductor device due to removal of the impurities.

SUMMARY OF THE INVENTION

The present invention is intended for a substrate processing method for processing a semiconductor substrate implanted with impurities.

According to an aspect of the present invention, the substrate processing method comprises a gas introduction step for introducing a reactive gas that reacts with silicon around a semiconductor substrate implanted with impurities, and a light irradiation step for irradiating the semiconductor substrate with light for an irradiation time not shorter than 0.1 milliseconds and not longer than 100 milliseconds to heat the semiconductor substrate.

Since the reactive gas that reacts with silicon is introduced around the semiconductor substrate implanted with impurities and the semiconductor substrate is irradiated with light for an irradiation time not shorter than 0.1 milliseconds and not longer than 100 milliseconds to heat the semiconductor substrate, it is possible to activate the impurities while suppressing thermal diffusion thereof and also to form a thin protection film on a surface of the semiconductor substrate for preventing removal of the impurities.

Preferably, the atmosphere around the semiconductor substrate is substituted with an inert gas after a lapse of a predetermined time from irradiation of the semiconductor substrate with light.

It is therefore possible to suppress excessive growth of the protection film.

Further, preferably, a film formed on a surface of the semiconductor substrate by reaction with the reactive gas is removed before electrode formation on the semiconductor substrate.

It is therefore possible to prevent the protection film from blocking electrode formation.

The present invention is also intended for a substrate processing apparatus for performing a heat treatment on a semiconductor substrate implanted with impurities.

According to another aspect of the present invention, the substrate processing apparatus comprises a chamber for accommodating the semiconductor substrate, a holding part for holding the semiconductor substrate in the chamber, a gas introduction part for introducing a reactive gas that reacts with silicon into the chamber; a light irradiation part for irradiating the semiconductor substrate held by the holding part with light for an irradiation time not shorter than 0.1 milliseconds and not longer than 100 milliseconds, and a gas introduction control part for controlling the timing of introducing the reactive gas into the chamber.

Since the reactive gas that reacts with silicon is introduced into the chamber accommodating the semiconductor substrate implanted with impurities and the semiconductor substrate is irradiated with light for an irradiation time not shorter than 0.1 milliseconds and not longer than 100 milliseconds, it is possible to activate the impurities while suppressing thermal diffusion thereof and also to form a thin protection film on a surface of the semiconductor substrate for preventing removal of the impurities.

Therefore, it is an object of the present invention to activate implanted impurities while preventing removal of the impurities.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a sectional side view showing a construction of a substrate processing apparatus in accordance with the present invention;

FIG. 4 is a plan view showing a hot plate;

FIG. 9 is a graph showing impurity concentration distributions in the vicinity of a surface of the semiconductor wafer on which a protection film is formed before and after cleaning;

DESCRIPTION OF THE PREFERRED EMBODIMENTS

Figure 2:
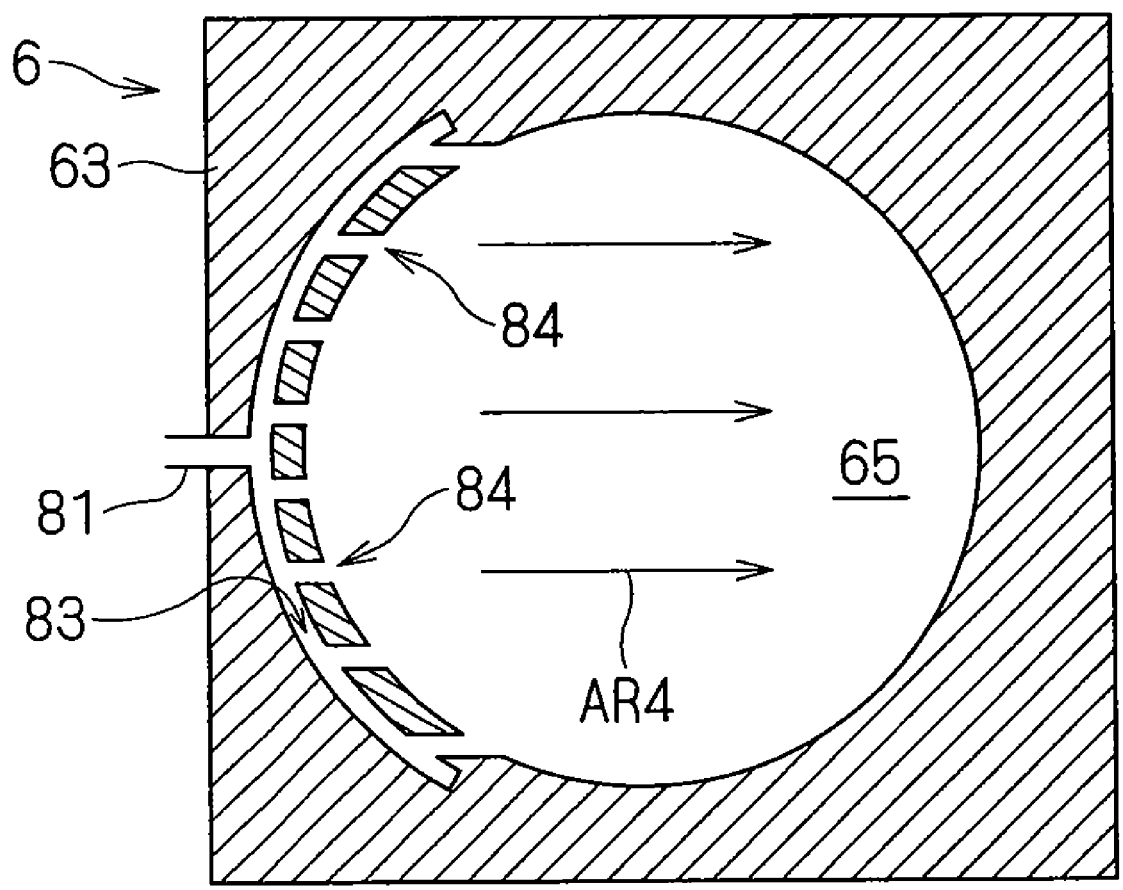
FIG. 2 is a sectional view showing a gas passage in the substrate processing apparatus of FIG. 1.

The preferred embodiments of the present invention will now be discussed in detail with reference to the drawings.

1. The First Preferred Embodiment

First, an overall construction of a substrate processing apparatus in accordance with the present invention will be outlined. FIG. 1 is a sectional side view showing a construction of a substrate processing apparatus 1 in accordance with the present invention. The substrate processing apparatus 1 is a lamp annealer for irradiating a semiconductor wafer W of generally circular shape, serving as a substrate, with flash light to heat the semiconductor wafer W.

The substrate processing apparatus 1 comprises a chamber 6 of generally cylindrical configuration for accommodating a semiconductor wafer W therein and a lamp house 5 containing a plurality of flash lamps FL. The substrate processing apparatus 1 further comprises a control part 3 for controlling operation mechanisms provided in the chamber 6 and the lamp house 5 to perform a heat treatment on the semiconductor wafer W.

The chamber 6 is provided below the lamp house 5, and consists of a chamber side portion 63 having an inner wall of generally cylindrical configuration, and a chamber bottom portion 62 for covering a bottom portion of the chamber side portion 63. A space surrounded by the chamber side portion 63 and the chamber bottom portion 62 is defined as a heat treatment space 65. A top opening 60 is formed over the heat treatment space 65 and closed with a chamber window 61 that is attached to it.

The chamber window 61 which is a constituent element of a ceiling of the chamber 6 is a disk-like member formed of quartz, serving as a quartz window through which the flash light emitted from the lamp house 5 passes toward the heat treatment space 65. The chamber bottom portion 62 and the chamber side portion 63 which constitute the main body of the chamber 6 are made of a metal material having high strength and high heat resistance such as stainless steel and the like. A ring 631 provided in an upper portion of the inner side surface of the chamber side portion 63 is made of an aluminum (Al) alloy and the like having greater durability against degradation resulting from light irradiation than stainless steel.

An O-ring provides a seal between the chamber window 61 and the chamber side portion 63 so as to maintain the hermeticity of the heat treatment space 65. Specifically, the O-ring is inserted between a lower-surface peripheral portion of the chamber window 61 and the chamber side portion 63 and a clamp ring 90 abuts against an upper-surface peripheral portion of the chamber window 61 to be secured to the chamber side portion 63 by screws, thereby forcing the chamber window 61 onto the O-ring.

The chamber bottom portion 62 is provided with a plurality of (in this preferred embodiment, three) upright support pins 70 extending through a holding part 7 for supporting the lower surface (a surface opposite to the surface onto which light is emitted from the lamp house 5) of the semiconductor wafer W. The support pins 70 are made of, e.g., quartz, and are easy to replace because the support pins 70 are fixed externally of the chamber 6.

The chamber side portion 63 includes a transfer opening 66 for loading and unloading the semiconductor wafer W therethrough into/from the chamber 6. The transfer opening 66 is openable and closable by a gate valve 185 pivoting about an axis 662. A gas inlet passage 81 for introducing a process gas into the heat treatment space 65 is connected to the side of the chamber side portion 63 opposite to the transfer opening 66. One end of the gas inlet passage 81 is connected to a gas inlet buffer 83 provided inside the chamber side portion 63 and the other end is communicated with the gas source 88. A gas valve 82 and a flow rate regulating valve 85 are interposed in some midpoints of the gas inlet passage 81. The gas source 88 supplies the gas inlet passage 81 with an inert gas such as nitrogen ($N_2$) gas, helium (He) gas, argon (Ar) gas or the like or a reactive gas such as oxygen ($O_2$) gas, ammonia ($NH_3$) gas or the like. The gas source 88 selectively supplies one of these gases or supplies a mixed gas. The transfer opening 66 is provided with an outlet passage 86 for exhausting the gas from the inside of the heat treatment space 65. The outlet passage 86 is connected through a gas valve 87 to a not-shown gas exhaust mechanism.

FIG. 2 is a sectional view of the chamber 6 taken along a horizontal plane at the level of the gas inlet buffer 83. As shown in FIG. 2, the gas inlet buffer 83 extends over approximately one-third of the inner periphery of the chamber side portion 63 on the opposite side to the transfer opening 66 shown in FIG. 1. By opening the gas valve 82, the process gas is supplied from the gas source 88 to the gas inlet passage 81 and guided to the gas inlet buffer 83, and further supplied into the heat treatment space 65 from a plurality of gas supply holes 84. The supply flow rate of the process gas is determined by the flow rate regulating valve 85. By opening the gas valve 87, the atmosphere inside the heat treatment space 65 is exhausted from the outlet passage 86. This forms a gas flow of the process gas in the heat treatment space 65, which is indicated by the arrows AR4 of FIG. 2.

Referring back to FIG. 1, the substrate processing apparatus 1 further comprises a substantially disk-like holding part 7 for holding the semiconductor wafer W being rested in a horizontal position inside the chamber 6 and preheating the held semiconductor wafer W before irradiation with flash light and a holding part elevating mechanism 4 for moving the holding part 7 up and down with respect to the chamber bottom portion 62 which is the bottom of the chamber 6. The holding part elevating mechanism 4 of FIG. 1 includes a shaft 41 of generally cylindrical configuration, a movable plate 42, guide members 43 (three guide members 43 are actually provided around the shaft 41 in this preferred embodiment), a fixed plate 44, a ball screw 45, a nut 46, and a motor 40. The chamber bottom portion 62 which is the bottom portion of the chamber 6 is formed with a bottom opening 64 of generally circular configuration having a diameter smaller than that of the holding part 7. The shaft 41 made of stainless steel is inserted through the bottom opening 64 and connected to the lower surface of the holding part 7 (a hot plate 71 of the holding part 7 in a strict sense) to support the holding part 7.

The nut 46 for threaded engagement with the ball screw 45 is fixed to the movable plate 42. The movable plate 42 is slidably guided by the guide member 43 fixed to the chamber bottom portion 62 and extending downwardly therefrom, and is vertically movable. The movable plate 42 is also coupled through the shaft 41 to the holding part 7.

The motor 40 is provided on the fixed plate 44 mounted to the lower end portion of the guide member 43, and is connected to the ball screw 45 through a timing belt 401. When the holding part elevating mechanism 4 moves the holding part 7 up and down, the motor 40 serving as a driving part rotates the ball screw 45 under the control of the control part 3 to move the movable plate 42 fixed to the nut 46 vertically along the guide member 43. As a result, the shaft 41 fixed to the movable plate 42 moves vertically, and the holding part 7 connected to the shaft 41 thereby smoothly moves up and down between a transfer position shown in FIG. 1 in which the semiconductor wafer W is transferred and a processing position shown in FIG. 5 in which the semiconductor wafer W is processed.

An upright mechanical stopper 451 of generally semi-cylindrical configuration (obtained by cutting a cylinder in half in a longitudinal direction) is provided on the upper surface of the movable plate 42 so as to extend along the ball screw 45. If the movable plate 42 is moving upward beyond a predetermined upper limit because of any anomaly, the upper end of the mechanical stopper 451 strikes an end plate 452 provided at an end portion of the ball screw 45, whereby the abnormal upward movement of the movable plate 42 is prevented. This avoids the upward movement of the holding part 7 over a predetermined position lying under the chamber window 61, to thereby prevent a collision between the holding part 7 and the chamber window 61.

The holding part elevating mechanism 4 further includes a manual elevating part 49 for manually moving the holding part 7 up and down during the maintenance of the inside of the chamber 6. The manual elevating part 49 has a handle 491 and a rotary shaft 492. Rotating the rotary shaft 492 by means of the handle 491 causes the rotation of the ball screw 45 connected to the rotary shaft 492 through a timing belt 495, to thereby move the holding part 7 up and down.

An expandable/contractible bellows 47 which surrounds the shaft 41 and extends downward from the chamber bottom portion 62 is provided under the chamber bottom portion 62, and an upper end of the bellows 47 is connected to the lower surface of the chamber bottom portion 62. On the other hand, a lower end of the bellows 47 is mounted to a bellows lower end plate 471. The bellows lower end plate 471 is screw-held and mounted to the shaft 41 by a collar member 411. The bellows 47 contracts when the holding part elevating mechanism 4 moves the holding part 7 up with respect to the chamber bottom portion 62, and expands when the holding part elevating mechanism 4 moves the holding part 7 down. Even when the holding part 7 moves up and down, the heat treatment space 65 is maintained hermetically since the bellows 47 contracts and expands.

Figure 3:
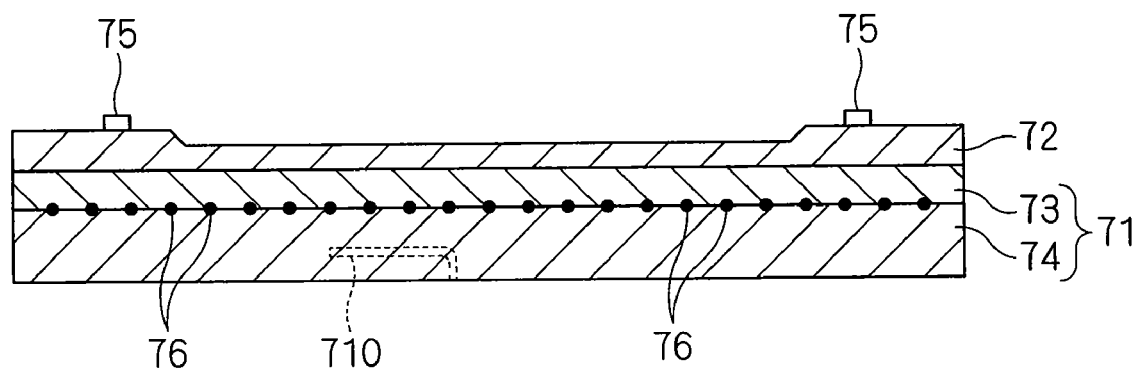
FIG. 3 is a sectional view showing a construction of a holding part.

FIG. 3 is a sectional view showing a construction of the holding part 7. The holding part 7 has a substantially disk-like shape with a diameter larger than that of the semiconductor wafer W. The holding part 7 includes a hot plate (heating plate) 71 for preheating (or assist-heating) the semiconductor wafer W, and a susceptor 72 provided on the upper surface (a surface on the side where the holding part 7 holds the semiconductor wafer W) of the hot plate 71. The shaft 41 for moving the holding part 7 up and down as mentioned above is connected to the lower surface of the holding part 7. The susceptor 72 is made of quartz (or may be made of aluminum nitride (AlN) or the like). Pins 75 for preventing the semiconductor wafer W from shifting out of place are mounted on the upper surface of the susceptor 72. The susceptor 72 is provided on the hot plate 71, with its lower surface in face-to-face contact with the upper surface of the hot plate 71. Thus, the susceptor 72 diffuses heat energy from the hot plate 71 to transfer the heat energy to the semiconductor wafer W rested on the upper surface of the susceptor 72, and is removable from the hot plate 71 for cleaning during the maintenance.

The hot plate 71 consists of an upper plate 73 and a lower plate 74 both of which are made of stainless steel. Resistance heating wires 76 such as nichrome wires or the like for heating the hot plate 71 are provided between the upper plate 73 and the lower plate 74, and an electrically conductive brazing nickel (Ni) fills the space between the upper plate 73 and the lower plate 74 to seal the resistance heating wires 76 therewith. End portions of the upper plate 73 and the lower plate 74 are bonded by brazing.

FIG. 4 is a plan view of the hot plate 71. As shown in FIG. 4, the hot plate 71 has a circular zone 711 and an annular zone 712 arranged in concentric relation with each other and positioned in a central portion of a region opposed to the semiconductor wafer W held by the holding part 7, and four zones 713 to 716 into which a substantially annular region surrounding the zone 712 is circumferentially equally divided. Slight gaps are formed between these zones 711 to 716. The hot plate 71 is provided with three through holes 77 through which the support pins 70 are inserted, respectively. The three through holes 77 are circumferentially spaced apart from one another every 120 degrees in a gap between the zones 711 and 712.

In the six zones 711 to 716, the resistance heating wires 76 independent of one another are disposed so as to make a circuit to form heaters, respectively. The heaters incorporated in the zones 711 to 716 individually heat the zones, respectively. The semiconductor wafer W held by the holding part 7 is heated by the heaters incorporated in the six zones 711 to 716. A sensor 710 for measuring the temperature of each zone by using a thermocouple is provided in each of the zones 711 to 716. The sensors 710 pass through the inside of the shaft 41 of generally cylindrical configuration and are connected to the control part 3.

For heating the hot plate 71, the control part 3 controls the amount of power supply to the respective resistance heating wires 76 provided in the zones 711 to 716 so that the respective temperatures of the six zones 711 to 716 measured by the sensors 710 should reach a predetermined temperature which is previously set. The temperature control in each zone by the control part 3 is PID (Proportional, Integral, Derivative) control. In the hot plate 71, the respective temperatures of the zones 711 to 716 are continually measured until the heat treatment of the semiconductor wafer W (if a plurality of semiconductor wafers W are successively heat-treated, the heat treatment of all the semiconductor wafers W) is completed, and the amounts of power supply to the respective resistance heating wires 76 provided in the zones 711 to 716 are individually controlled, that is, the temperatures of the respective heaters incorporated in the zones 711 to 716 are individually controlled, whereby the respective temperatures of the zones 711 to 716 are maintained at set temperatures. The respective set temperatures for the zones 711 to 716 may be changed from a reference temperature by individually-set offset values.

Figure 6:
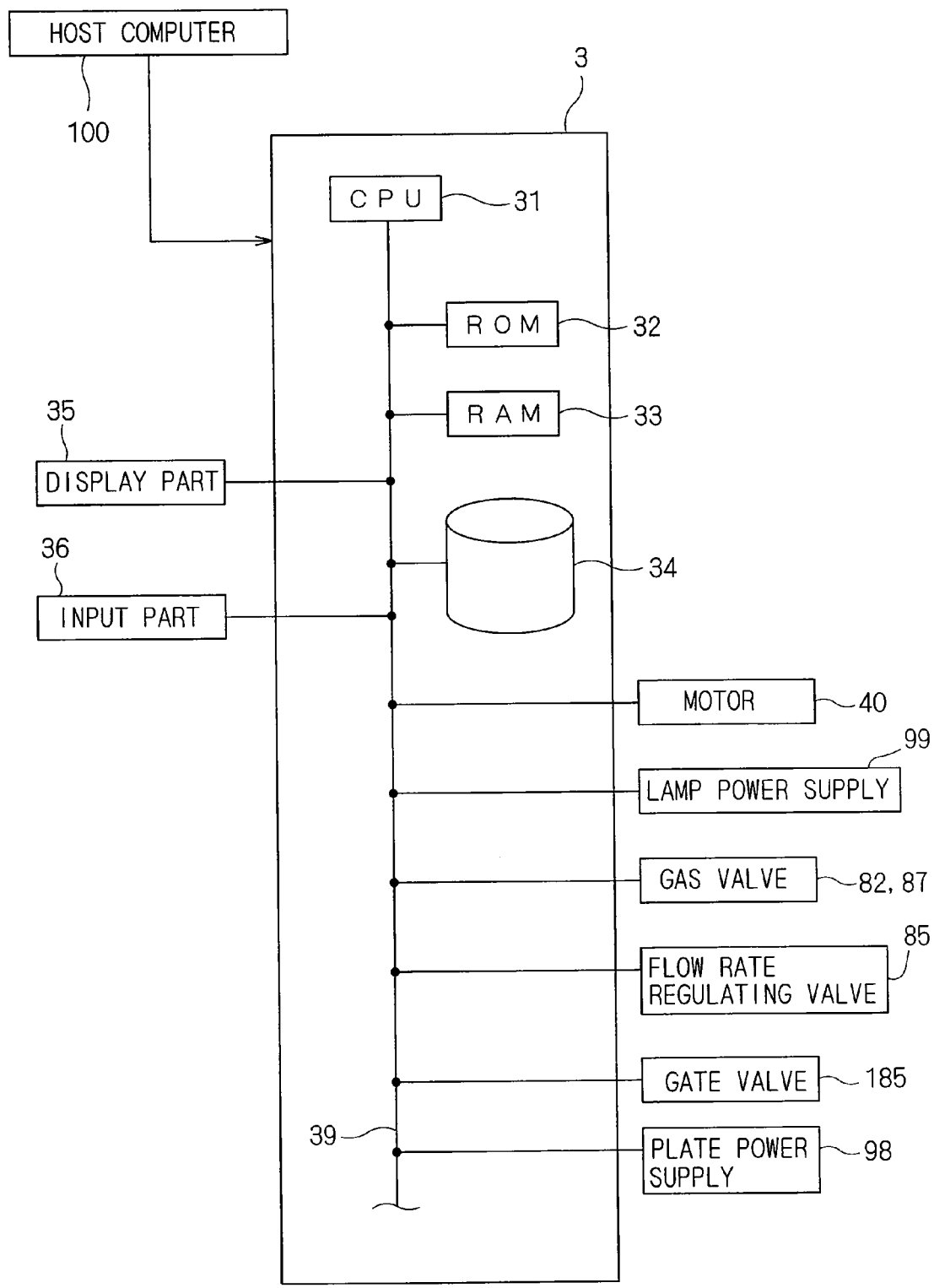
FIG. 6 is a block diagram showing a construction of a control part.

The respective resistance heating wires 76 provided in the six zones 711 to 716 are connected through power lines passing through the inside of the shaft 41 to a plate power supply 98 (see FIG. 6). At some midpoint in the path from the plate power supply 98 to the zones 711 to 716, the power lines extending from the plate power supply 98 are disposed inside a stainless tube filled with an insulator of magnesia (magnesium oxide) or the like so as to be electrically insulated from each other. The inside of the shaft 41 is open to the atmosphere.

Next, the lamp house 5 is provided above the chamber 6. The lamp house 5 comprises a light source formed of a plurality of (thirty, in this preferred embodiment) xenon flash lamps FL and a reflector 52 which is so provided as to cover the upper portion of the light source, which are disposed inside a case 51. A lamp light radiation window 53 is fitted to the bottom of the case 51 of the lamp house 5. The lamp light radiation window 53 which is a floor portion of the case 51 of the lamp house 5 is a plate member made of quartz. Since the lamp house 5 is provided above the chamber 6, the lamp light radiation window 53 is opposed to the chamber window 61. The lamp house 5 irradiates the semiconductor wafer W held by the holding part 7 in the chamber 6 with flash light from the flash lamps FL through the lamp light radiation window 53 and the chamber window 61 to heat the semiconductor wafer W.

A plurality of flash lamps FL, each of which is a rod lamp of long-length cylindrical configuration, are arranged in a plane with their longitudinal directions in parallel with one another along the main surface (i.e., along the horizontal direction) of the semiconductor wafer W held by the holding part 7. Therefore, the plane formed of arrangement of the flash lamps FL is a horizontal plane. The area of the plane formed of arrangement of a plurality of flash lamps FL is al least larger than that of the semiconductor wafer W held by the holding part 7.

The xenon flash lamp FL comprises a rod-like glass tube (discharge tub) which is filled with xenon gas and provided with an anode and a cathode connected to a capacitor at its respective ends and a trigger electrode coiled proximally to the outer peripheral surface of the glass tube. Since the xenon gas is an electrical insulator, no electricity flows in the glass tube in a normal state even if electric charges are accumulated in the capacitor. In a case where a high voltage is applied to the trigger electrode to break the insulation, however, the electricity accumulated in the capacitor quickly flows into the glass tube by discharge between the electrodes at both ends and light is emitted by excitation of atoms or molecules of the xenon at that time. Such a xenon flash lamp FL, in which the electrostatic energy accumulated in the capacitor in advance is converted into an extremely short light pulse ranging from 0.1 to 100 milliseconds, has a characteristic feature of emitting an extremely intense light as compared with a light source of successive lighting. The light emission time of the flash lamp FL can be controlled by the coil constant of a lamp power supply 99 (see FIG. 6) for supplying the flash lamp FL with power.

The reflector 52 is provided over the plurality of flash lamps FL to entirely cover them. The basic function of the reflector 52 is to reflect the flash light emitted from the plurality of flash lamps FL towards the holding part 7. The reflector 52 is made of an aluminum alloy plate and its surface (on the side facing the flash lamps FL) is roughened by abrasive blasting to have a satin finish thereon. The reason why the surface is roughened in such a manner is that if the surface of the reflector 52 has a complete mirror finish, there arises a regular pattern in intensity of the reflected light from the flash lamps FL to degrade the uniformity of surface temperature distribution of the semiconductor wafer W.

The control part 3 controls the above various operation mechanisms provided in the substrate processing apparatus 1. FIG. 6 is a block diagram showing a construction of the control part 3. The control part 3 has a constitution of general computer system as hardware. Specifically, the control part 3 has a constitution in which a CPU 31 for performing various computations, a ROM 32 for storing a basic program, a RAM 33 which is a readable and writable memory for storing various information, a magnetic disk 34 for storing control applications, data or the like are connected to a bus line 39.

To the bus line 39, the motor 40 of the holding part elevating mechanism 4 for moving the holding part 7 up and down in the chamber 6, the lamp power supply 99 for supplying the flash lamp FL with power, the gas valves 82 and 87 and the flow rate regulating valve 85 for supplying and exhausting the process gas into the chamber 6, the gate valve 185 for opening and closing the transfer opening 66, the plate power supply 98 for supplying the zones 711 to 716 of the hot plate 71 with power and the like are electrically connected. The CPU 31 of the control part 3 executes the control applications stored in the magnetic disk 34 to control these operation mechanisms, to thereby allow the heat treatment on the semiconductor wafer W to proceed.

To the bus line 39, a display part 35 and an input part 36 are also electrically connected. The display part 35 includes, e.g., a liquid crystal display (LCD) and the like and displays various information such as a processing result, details of a recipe and the like. The input part 36 includes, e.g., a keyboard, a mouse and the like and receives inputs such as commands, parameters and the like. An operator of this apparatus can perform an input of commands, parameters and the like from the input part 36 while checking the contents displayed on the display part 35. Further, a touch panel into which the display part 35 and the input part 36 are integrated may be used.

Besides the above constituent elements, the substrate processing apparatus 1 comprises various cooling mechanisms to prevent an excessive rise in temperature of the chamber 6 and the lamp house 5 by the heat energy generated from the flash lamps FL and the hot plate 71 in the heat treatment of the semiconductor wafer W. For example, a water cooled tube (not shown) is provided on the chamber side portion 63 and the chamber bottom portion 62 of the chamber 6. The lamp house 5 is provided with a gas supply tube 55 and an exhaust tube 56 for forming a gas flow inside the lamp house 5 to exhaust heat, which constitute an air cooling structure (see FIGS. 1 and 5). Air is supplied into a gap between the chamber window 61 and the lamp light radiation window 53 to cool the lamp house 5 and the chamber window 61.

Figure 7:
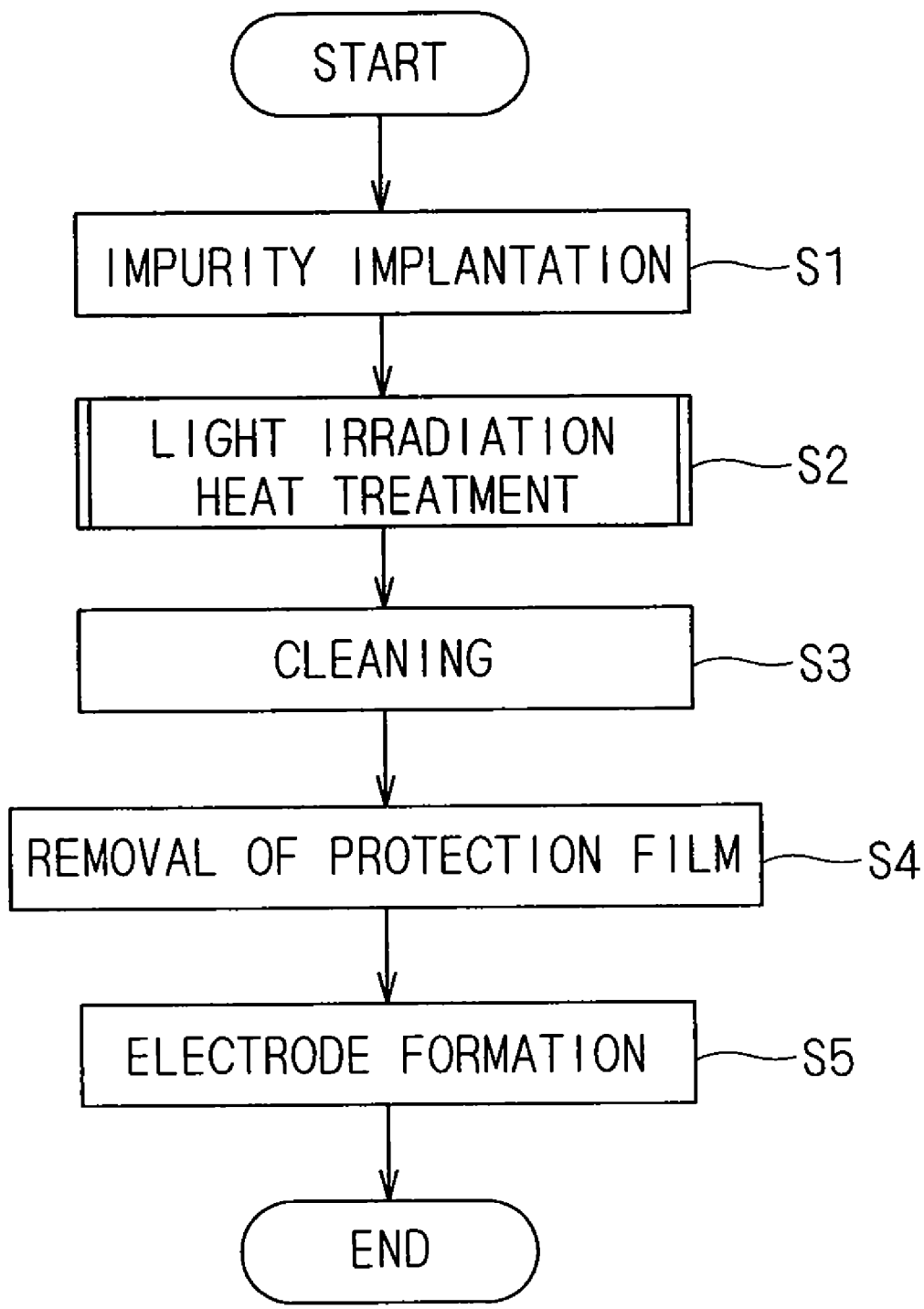
FIG. 7 is a flowchart showing part of an operation flow for processing a semiconductor wafer.

Next, a procedure for processing the semiconductor wafer W will be discussed. FIG. 7 is a flowchart showing part of an operation flow for processing the semiconductor wafer W. Patterns are formed on a surface of the silicon semiconductor wafer W by using a photolithography technique and impurities such as boron (B) or the like are implanted into a region requiring impurity implantation (Step S1). The impurity implantation is performed by an ion implantation method. The implanted impurities are activated by a light irradiation heat treatment process (annealing process) in the substrate processing apparatus 1 (Step S2). The light irradiation heat treatment on the semiconductor wafer W in the substrate processing apparatus 1 will be discussed later in detail.

A cleaning process is performed on the semiconductor wafer W after being subjected to the annealing process in the substrate processing apparatus 1 (Step S3). Herein, the cleaning process is so-called RCA cleaning where extraneous matters are cleared off from the semiconductor wafer W by using an SC1 (Standard Clean 1) solution made of aqueous ammonia and oxygenated water and an SC2 (Standard Clean 2) solution made of hydrochloric acid and oxygenated water. Though electrode formation is performed (Step S5) after that, in this preferred embodiment, a process of removing a protection film formed on the surface of the semiconductor wafer W is performed (Step S4) before the electrode formation. This removal process will be also discussed later.

Figure 8:
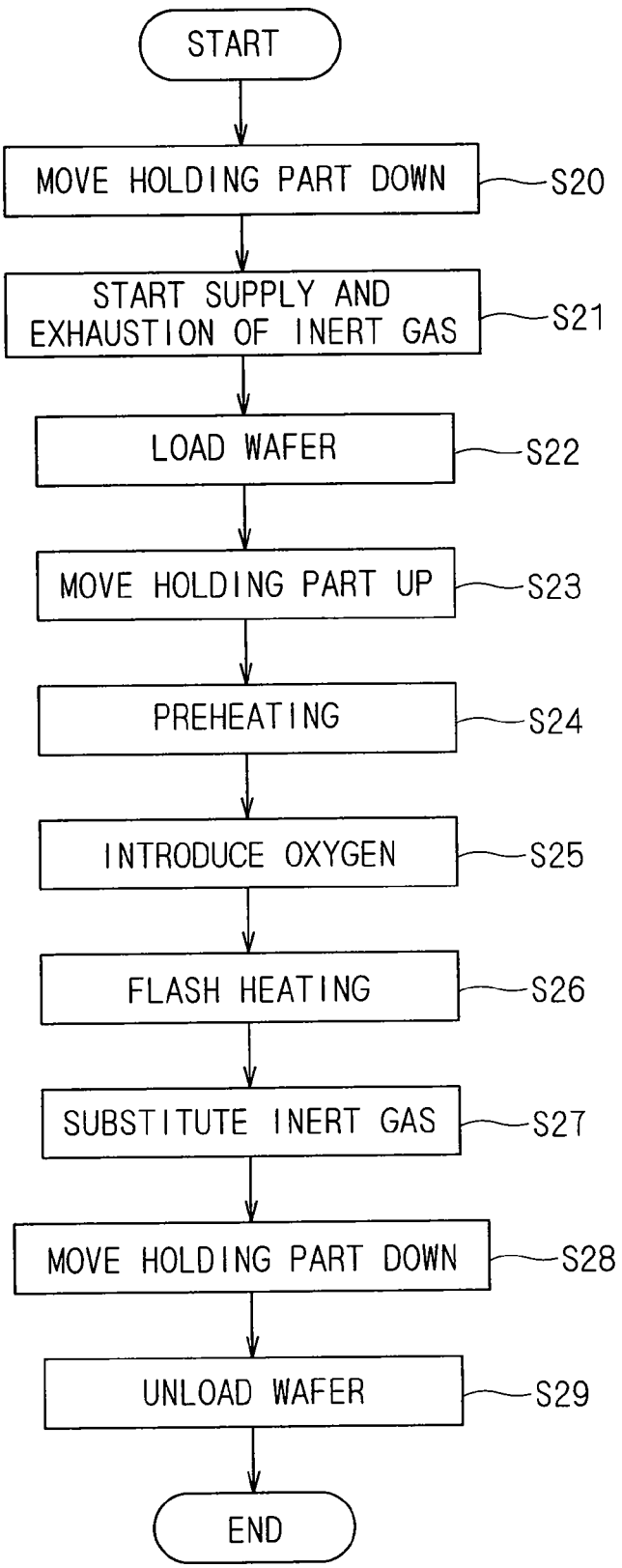
FIG. 8 is a flowchart showing an exemplary process for processing the semiconductor wafer in the substrate processing apparatus.

FIG. 8 is a flowchart showing a procedure for processing the semiconductor wafer W in the substrate processing apparatus 1. The procedure for processing the semiconductor wafer W shown in FIG. 8 is carried out by the control part 3 controlling the operation mechanisms of the substrate processing apparatus 1.

Figure 5:
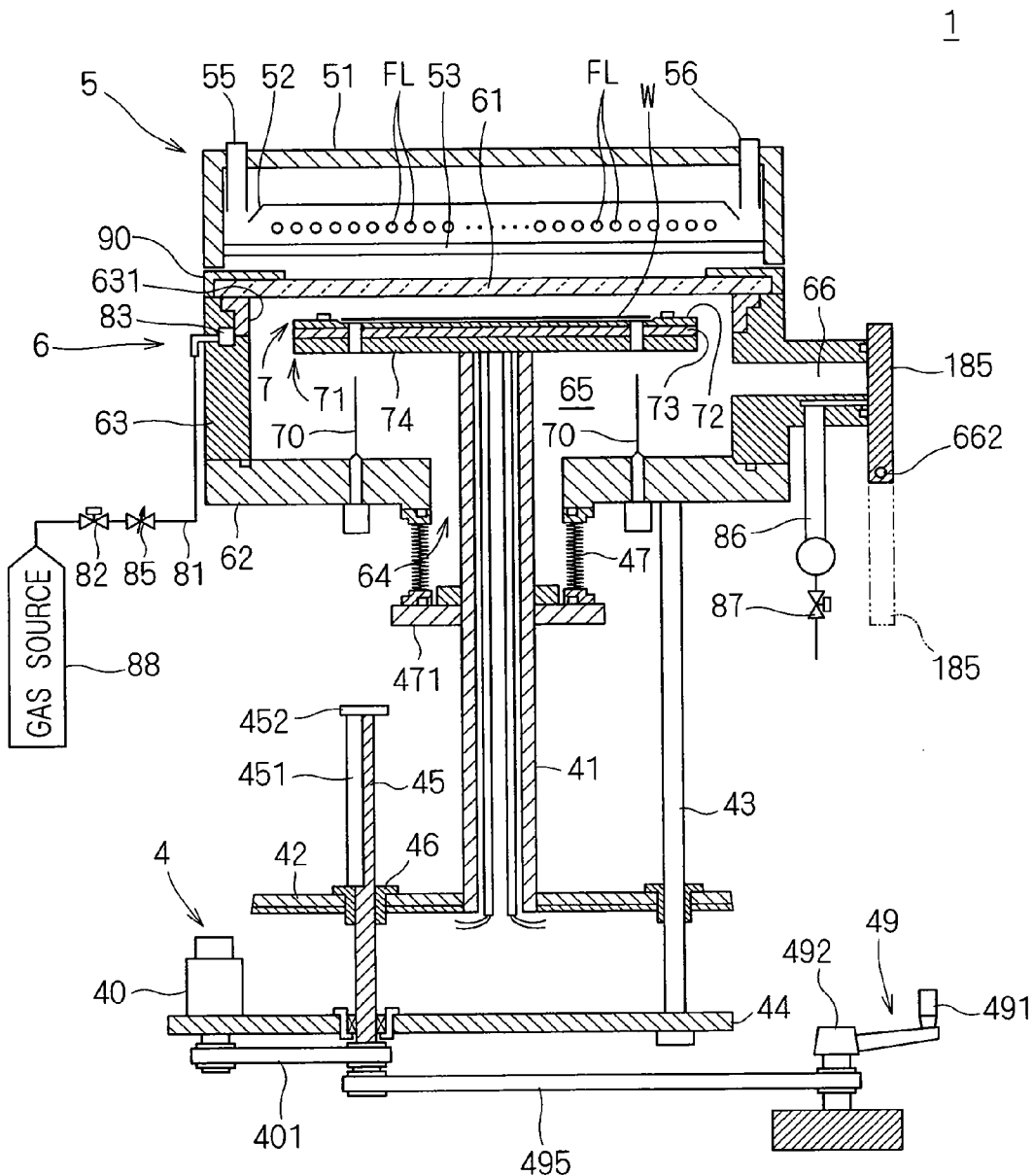
FIG. 5 is a sectional side view showing the construction of the substrate processing apparatus of FIG. 1.

First, the holding part 7 moves down from the processing position shown in FIG. 5 to the transfer position shown in FIG. 1 (Step S20). The "processing position" is the position of the holding part 7 in irradiation of the semiconductor wafer W with light from the flash lamps FL, which is the position of the holding part 7 in the chamber 6 shown in FIG. 5. The "transfer position" is the position of the holding part 7 in loading and unloading of the semiconductor wafer W into/from the chamber 6, which is the position of the holding part 7 in the chamber 6 shown in FIG. 1. The reference position of the holding part 7 in the substrate processing apparatus 1 is the processing position, and before the processing, the holding part 7 is present at the processing position and when the processing starts, the holding part 7 moves down to the transfer position.

The holding part 7 moves up and down with respect to the support pins 70 fixed to the chamber 6, and as shown in FIG. 1, when the holding part 7 moves down to the transfer position, it comes close to the chamber bottom portion 62 and the respective tips of the support pins 70 penetrate the holding part 7 and protrude over the holding part 7.

Next, when the holding part 7 moves down to the transfer position, the gas valve 82 is opened and an inert gas (nitrogen gas in this preferred embodiment) is thereby supplied into the heat treatment space 65 of the chamber 6 from the gas source 88. At the same time, the gas valve 87 is opened and the gas in the heat treatment space 65 is thereby exhausted (Step S21). The nitrogen gas supplied into the chamber 6 flows in the direction indicated by the arrows AR4 of FIG. 2 in the heat treatment space 65 from the gas inlet buffer 83 and is exhausted through the outlet passage 86 and the gas valve 87 by utility emission. Further, part of the nitrogen gas supplied into the chamber 6 is exhausted also from an exhaust port (not shown) provided inside the bellows 47.

Subsequently, the gate valve 185 is opened to open the transfer opening 66, and the semiconductor wafer W is loaded into the chamber 6 through the transfer opening 66 by a transfer robot provided outside this apparatus and placed on the plurality of support pins 70 (Step S22). Further, the amount of nitrogen gas to be purged into the chamber 6 in loading of the semiconductor wafer W is controlled by the flow rate regulating valve 85 to about 40 l/min.

After the semiconductor wafer W is loaded into the chamber 6, the gate valve 185 closes the transfer opening 66. Then, the holding part elevating mechanism 4 moves the holding part 7 up from the transfer position to the processing position close to the chamber window 61 (Step S23). In the course of moving the holding part 7 up from the transfer position, the semiconductor wafer W is transferred from the support pins 70 to the susceptor 72 of the holding part 7 and placed and held on the upper surface of the susceptor 72. When the holding part 7 moves up to the processing position, the semiconductor wafer W held by the susceptor 72 is also kept at the processing position.

Each of the six zones 711 to 716 of the hot plate 71 is already heated up to a predetermined temperature by the heater (the resistance heating wire 76) individually provided within each of the zones 711 to 716 (between the upper plate 73 and the lower plate 74). The holding part 7 is moved up to the processing position and the semiconductor wafer W comes into contact with the holding part 7, whereby the semiconductor wafer W is preheated by the heater provided in the hot plate 71 and the temperature thereof increases gradually (Step S24).

Preheating of the semiconductor wafer W at the processing position for about 60 seconds increases the temperature of the semiconductor wafer W up to a preheating temperature T1 which is set in advance. The preheating temperature T1 is set ranging from about 200° C. to about 600° C., preferably from about 350° C. to about 550° C., at which there is no apprehension that the impurities implanted in the semiconductor wafer W might be diffused by heat. A distance between the holding part 7 and the chamber window 61 is adjustable to any value by controlling the amount of rotation of the motor 40 of the holding part elevating mechanism 4.

While the preheating of the semiconductor wafer W is performed at the processing position, oxygen gas is introduced into the heat treatment space 65 of the chamber 6 (Step S25). Specifically, the oxygen gas is supplied into the heat treatment space 65 from the gas source 88 through the gas inlet passage 81. At that time, only the oxygen gas may be supplied or a mixed gas of nitrogen and oxygen may be supplied. In any case, the oxygen gas to be supplied into the heat treatment space 65 is an extremely small amount, and specifically, the control part 3 controls the gas valve 82 and the flow rate regulating valve 85 so that the concentration of oxygen in the atmosphere around said semiconductor wafer W held by the holding part 7 at processing position may range from 100 ppm to 10%. Further, when the oxygen gas is introduced, the gas valve 87 for exhausting air is closed.

After a lapse of the preheating time of about 60 seconds, flash light is emitted from the flash lamps FL of the lamp house 5 toward the semiconductor wafer W under the control of the control part 3 in the state where the oxygen gas is introduced around the semiconductor wafer W held by the holding part 7 at the processing position (Step S26). At that time, part of the flash light emitted from the flash lamps FL travels directly to the holding part 7 inside the chamber 6. The remainder of the flash light is reflected by the reflector 52, and the reflected light travels to the inside of the chamber 6. Such emission of the flash light achieves the flash heating of the semiconductor wafer W. The flash heating, which is achieved by emission of flash light from the flash lamps FL, can raise the surface temperature of the semiconductor wafer W in a short time.

Specifically, the flash light emitted from the flash lamps FL of the lamp house 5 is an intense flash of light emitted for an extremely short period of time not shorter than 0.1 milliseconds and not longer than 100 milliseconds because the previously stored electrostatic energy is converted into such an ultrashort light pulse. The surface temperature of the semiconductor wafer W subjected to the flash heating by emission of flash light from the flash lamps FL momentarily rises to a heat treatment temperature T2 not lower than about 800° C. and not higher than about 1300° C. After the impurities implanted in the semiconductor wafer W are activated, the surface temperature decreases quickly. Because of the capability of increasing and decreasing the surface temperature of the semiconductor wafer W in an extremely short time, the substrate processing apparatus 1 can achieve the activation of the impurities implanted in the semiconductor wafer W while suppressing the diffusion of the impurities due to heat. Since the time period required for the activation of the implanted impurities is extremely short as compared with the time period required for the thermal diffusion of the implanted impurities, the activation is completed in a short time ranging from about 0.1 to about 100 milliseconds during which no diffusion occurs.

Further, a thin oxide film is formed on the surface of the semiconductor wafer W by the flash heating. Though the temperature where a silicon oxide film is formed is 800° C. or more, the time period while the surface temperature of the semiconductor wafer W is 800° C. or more is extremely short since the time for emission by the flash lamps FL is extremely short, not shorter than 0.1 milliseconds and not longer than 100 milliseconds. Therefore, regardless of the concentration of oxygen around said semiconductor wafer W, the thickness of the oxide film to be formed is extremely thin, about 2 nm.

At the time when a predetermined time (several seconds) elapses after the flash heating is completed, the nitrogen gas is supplied into the heat treatment space 65 from the gas source 88 again while gas containing oxygen gas is exhausted from the heat treatment space 65 through the outlet passage 86. The atmosphere around said semiconductor wafer W in the heat treatment space 65 is thereby substituted with the nitrogen gas (Step S27). Consequently, the growth of the oxide film on the surface of the semiconductor wafer W is surely stopped.

After that, the holding part 7 is moved down again to the transfer position shown in FIG. 1 by the holding part elevating mechanism 4, and the semiconductor wafer W is transferred from the holding part 7 to the support pins 70 (Step S28). Subsequently, the gate valve 185 opens the transfer opening 66 having been closed, and the transfer robot provided outside this apparatus unloads the semiconductor wafer W rested on the support pins 70. Thus, the flash heating process (annealing process) on the semiconductor wafer W in the substrate processing apparatus 1 is completed (Step S29).

As discussed above, in the first preferred embodiment, the oxygen gas is introduced around the semiconductor wafer W implanted with impurities and then the semiconductor wafer W is irradiated with the flash of light emitted from the flash lamps FL for an irradiation time not shorter than 0.1 milliseconds and not longer than 100 milliseconds, to thereby momentarily raise the surface temperature of the semiconductor wafer W up to not lower than 800° C. and not higher than 1300° C. This makes it possible to activate the impurities while suppressing the thermal diffusion of the impurities, and at the same time an extremely thin oxide film is formed on the surface of the semiconductor wafer W.

Though the cleaning process is performed on the semiconductor wafer W after being subjected to the annealing process in the substrate processing apparatus 1 (Step S3 of FIG. 7), since the oxide film is formed on the surface of the semiconductor wafer W, this film serves as a protection film to prevent removal of the impurities in the cleaning process.

Figure 11:
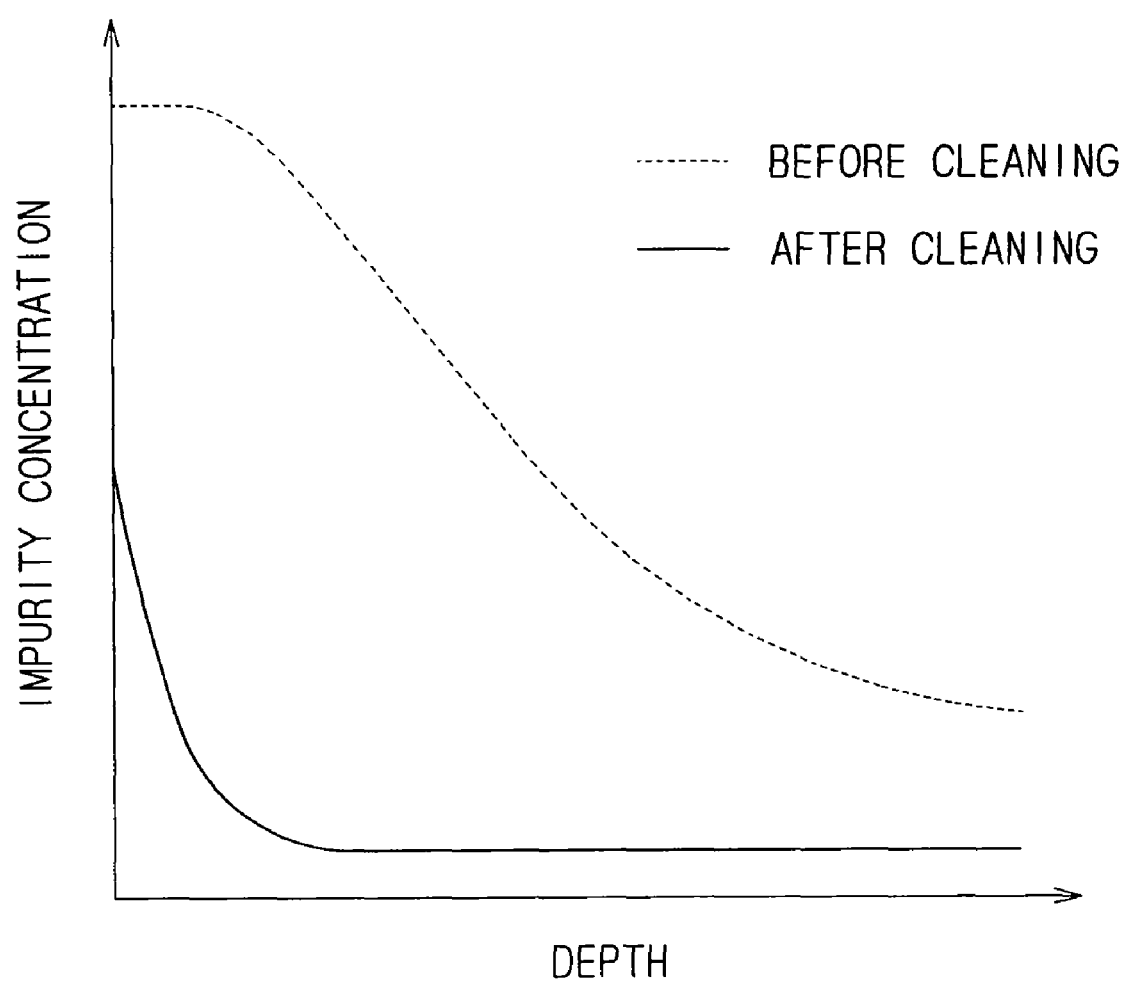
FIG. 11 is a graph showing impurity concentration distributions in the vicinity of a surface of a semiconductor wafer before and after cleaning in the background art.

FIG. 9 is a graph showing impurity concentration distributions in the vicinity of the surface of the semiconductor wafer W on which the protection film is formed before and after cleaning. Like FIG. 11, in FIG. 9, the horizontal axis represents the depth from the surface of the semiconductor wafer W and the vertical axis represents the impurity concentration. FIGS. 9 and 11 are concentration profiles of the impurities achieved by performing the surface analysis using SIMS (Secondary Ion Mass Spectrometry) on the semiconductor wafer W. As is clear from the comparison between FIGS. 9 and 11, formation of a protection film (oxide film) on the semiconductor wafer W significantly suppresses removal of the impurities in the cleaning process. Further, the semiconductor wafer W on which a protection film is formed has no variation in sheet resistance value before and after cleaning, and this matches the analysis result by the SIMS.

Like in the background art, even if light irradiation is performed by using the halogen lamp for an irradiation time for over one second to raise the temperature of the semiconductor wafer W up to 800° C. or more, it is possible to form an oxide film on the surface of the semiconductor wafer W. As discussed earlier, however, a long-time heating for over one second causes thermal diffusion of impurities to make it impossible to provide a shallow junction. Further, the long-time heating for over one second forms an oxide film whose thickness is significantly thicker than that of the oxide film formed in the first preferred embodiment. Since the oxide film grows while consuming the silicon on the surface of the semiconductor wafer W, when the oxide film becomes significantly thicker, the impurities are also taken into the oxide film, disadvantageously, to impair the function as a semiconductor device.

As shown in the first preferred embodiment, after introduction of the oxygen gas around the semiconductor wafer W implanted with impurities, irradiation with flash light from the flash lamps FL for the irradiation time not shorter than 0.1 milliseconds and not longer than 100 milliseconds allows not only activation of the impurities while suppressing thermal diffusion thereof but also formation of an extremely thin oxide film having a thickness of about 2 nm. Since such a thin oxide film consumes almost no layer implanted with impurities, the impurities to be taken in the oxide film is an extremely small amount. Further, as shown in FIG. 9, even an extremely thin oxide film sufficiently serves as a protection film against the cleaning process and can prevent removal of the impurities.

Since even a thin oxide film blocks the electrode formation (Step S5 of FIG. 7), however, the process of removing the oxide film is performed (Step S4 of FIG. 7) before the electrode formation. For removing the oxide film, dry etching or wet etching using hydrofluoric acid solution (HF) having a concentration of about 5% is performed.

2. The Second Preferred Embodiment

Figure 10:
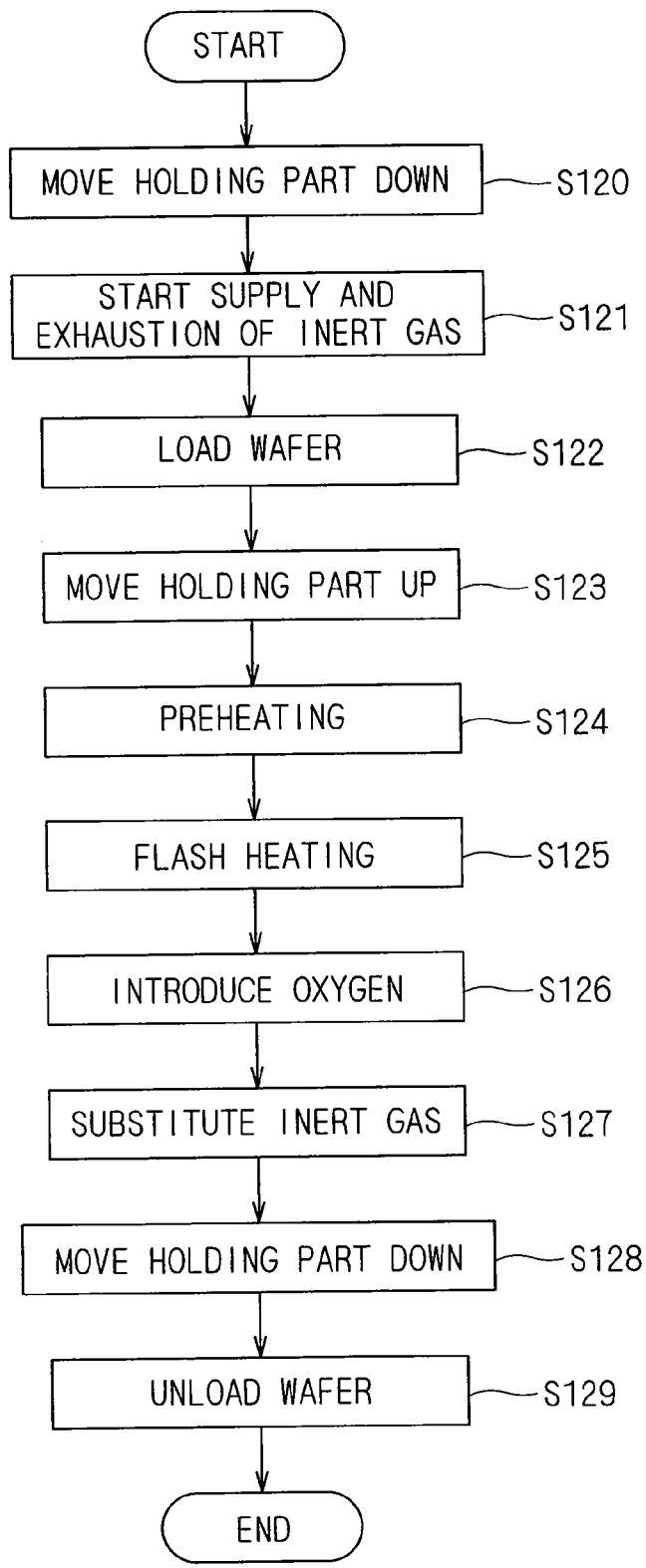
FIG. 10 is a flowchart showing another exemplary process for processing the semiconductor wafer in the substrate processing apparatus.

Next, the second preferred embodiment of the present invention will be discussed. The construction of the substrate processing apparatus 1 of the second preferred embodiment is completely the same as that of the first preferred embodiment. Further, the flow of operation on the semiconductor wafer W is the same as shown in FIG. 7 of the first preferred embodiment. The second preferred embodiment is different from the first preferred embodiment only in the process steps for processing the semiconductor wafer W in the substrate processing apparatus 1. FIG. 10 is a flowchart showing another exemplary process for processing the semiconductor wafer W in the substrate processing apparatus 1.

Steps S120 to S124 of FIG. 10 are the same as Steps S20 to S24 of FIG. 8. Specifically, the holding part 7 moves down from the processing position shown in FIG. 5 to the transfer position shown in FIG. 1 (Step S120), and supply and exhaustion of the nitrogen gas into/from the heat treatment space 65 starts (Step S121). Then, the gate valve 185 is opened to open the transfer opening 66 and the semiconductor wafer W is loaded into the chamber 6 and placed on the plurality of support pins 70 (Step S122). After that, the transfer opening 66 is closed by the gate valve 185 and the holding part 7 moves up from the transfer position to the processing position (Step S123). In the course of moving the holding part 7 up from the transfer position, the semiconductor wafer W is transferred from the support pins 70 to the susceptor 72 of the holding part 7 and preheated by the heater provided in the hot plate 71 (Step S124).

Preheating is performed for about 60 seconds at the processing position, and the temperature of the semiconductor wafer W rises to the preheating temperature T1 which is set in advance. The preheating temperature T1 is set ranging from about 200° C. to about 600° C., preferably from about 350° C. to about 550° C., at which there is no apprehension that the impurities implanted in the semiconductor wafer W might be diffused by heat.

In the second preferred embodiment, after a lapse of the preheating time of about 60 seconds, flash light is emitted from the flash lamps FL of the lamp house 5 toward the semiconductor wafer W under the control of the control part 3 while the holding part 7 is present at the processing position (Step S125). At that time, there is a nitrogen gas atmosphere around the semiconductor wafer W held by the holding part 7.

In the second preferred embodiment, within five seconds after emission of flash light onto the semiconductor wafer W held by the holding part 7 at processing position, the oxygen gas is introduced into the heat treatment space 65 (Step S126). At that time, only the oxygen gas may be supplied or a mixed gas of nitrogen and oxygen may be supplied. In any case, like in the first preferred embodiment, the oxygen gas to be supplied into the heat treatment space 65 is an extremely small amount, and specifically, the control part 3 controls the gas valve 82 and the flow rate regulating valve 85 so that the concentration of oxygen in the atmosphere around said semiconductor wafer W held by the holding part 7 at processing position may range from 100 ppm to 10%. Further, when the oxygen gas is introduced, the gas valve 87 for exhausting air is closed.

The flash light emitted from the flash lamps FL of the lamp house 5 is an intense flash of light emitted for an extremely short period of time not shorter than about 0.1 milliseconds and not longer than about 100 milliseconds because the previously stored electrostatic energy is converted into such an ultrashort light pulse. The surface temperature of the semiconductor wafer W subjected to the flash heating by emission of a flash of light from the flash lamps FL momentarily rises to a heat treatment temperature T2 not lower than about 800° C. and not higher than about 1300° C. After the impurities implanted in the semiconductor wafer W are activated, the surface temperature decreases quickly. Like in the first preferred embodiment, because of the capability of increasing and decreasing the surface temperature of the semiconductor wafer W in an extremely short time, the substrate processing apparatus 1 can achieve the activation of the impurities implanted in the semiconductor wafer W while suppressing the diffusion of the impurities due to heat.

Within five seconds after emission of flash light, the heat of flash heating remains on the surface of the semiconductor wafer W. For this reason, if the oxygen gas is introduced around the semiconductor wafer W within five seconds after emission of flash light, a thin oxide film is formed on the surface of the semiconductor wafer W due to the remaining heat. The thickness of the formed oxide film is extremely thin, about 2 nm, like in the first preferred embodiment.

If the oxygen gas is introduced after a time period over five seconds elapses after emission of flash light, no oxide film grows on the surface of the semiconductor wafer W since the surface temperature of the semiconductor wafer W is too low. For this reason, for formation of an oxide film, it is preferable that the oxygen gas should be introduced around the semiconductor wafer W in a time as short as possible from emission of flash light, and it is possible to form an oxide film if the oxygen gas is introduced within five seconds after emission of flash light and it is preferable to introduce the oxygen gas within two seconds.

After that, at the time when a predetermined time (several seconds) elapses after the flash heating is completed, the nitrogen gas is supplied into the heat treatment space 65 from the gas source 88 again while gas containing the oxygen gas is exhausted from the heat treatment space 65 through the outlet passage 86. The atmosphere around said semiconductor wafer W in the heat treatment space 65 is thereby substituted with the nitrogen gas (Step S127). Consequently, the growth of the oxide film on the surface of the semiconductor wafer W is surely stopped. Further, in the second preferred embodiment, after a time period over five seconds elapses after the flash heating is completed, the atmosphere in the heat treatment space 65 is substituted with the nitrogen gas.

Next, the holding part 7 is moved down again to the transfer position shown in FIG. 1, and the semiconductor wafer W is transferred from the holding part 7 to the support pins 70 (Step S128). Subsequently, the gate valve 185 opens the transfer opening 66 having been closed, and the transfer robot provided outside this apparatus unloads the semiconductor wafer W rested on the support pins 70. Thus, the flash heating process on the semiconductor wafer W in the substrate processing apparatus 1 is completed (Step S129).

Thus, in the second preferred embodiment, within five seconds after the semiconductor wafer W implanted with impurities is irradiated with the flash of light emitted from the flash lamps FL for the irradiation time not shorter than 0.1 milliseconds and not longer than 100 milliseconds, the oxygen gas is introduced around the semiconductor wafer W. Also with this operation, it is possible not only to activate the impurities while suppressing thermal diffusion thereof but also to form an extremely thin oxide film having a thickness of about 2 nm on the surface of the semiconductor wafer W. Since such a thin oxide film consumes almost no layer implanted with impurities, there is no case where the impurities become deficient in the surface of the semiconductor wafer W. As discussed above, even an extremely thin oxide film having a thickness of about 2 nm sufficiently serves as a protection film against the cleaning process and can prevent removal of the impurities.

3. Variations

Thus, the preferred embodiments of the present invention have been discussed above, but numerous modifications and variations can be devised without departing from the scope of the invention. For example, though the oxygen gas is introduced around the semiconductor wafer W in the above preferred embodiments, a gas to be introduced is not limited to the oxygen gas but any reactive gas that can form a film by reaction with silicon may be used. The reactive gas includes an oxidizing gas that forms an oxide film by reaction with silicon and a nitriding gas that forms a nitride film by reaction with silicon. The oxidizing gas includes ozone ($O_3$) gas as well as the oxygen gas discussed in the above preferred embodiments. The nitriding gas includes ammonia ($NH_3$) gas and nitrogen dioxide ($NO_2$). As the reactive gas, silane ($SiH_4$) and disilane ($Si_2H_6$) may be also used. Like in the first preferred embodiment, any of these reactive gases is introduced around the semiconductor wafer W implanted with impurities and then the semiconductor wafer is irradiated with the flash of light emitted from the flash lamps FL for the irradiation time not shorter than 0.1 milliseconds and not longer than 100 milliseconds, or like in the second preferred embodiment, within five seconds after the semiconductor wafer W implanted with impurities is irradiated with the flash of light, any of these reactive gases is introduced, whereby a thin protection film can be formed on the surface of the semiconductor wafer W. Consequently, it is possible to activate the impurities implanted in the semiconductor wafer W while suppressing thermal diffusion thereof and also to prevent removal of the impurities in the cleaning process.

Further, though the inert gas such as the nitrogen gas or the like and the reactive gas such as the oxygen gas or the like are introduced into the chamber 6 through the same path in the above preferred embodiments, these gases can be supplied from different sources through different paths.

Though the inert gas is the nitrogen gas in the above preferred embodiments, the inert gas may be argon gas or helium gas. From the viewpoint of curbing an increase in cost for the process, however, it is preferable to use the nitrogen gas.

The light source for emission of light is not limited to the flash lamps FL but any light source that allows light irradiation for the irradiation time not shorter than 0.1 milliseconds and not longer than 100 milliseconds, e.g., a laser, may be used.

Further, though the reactive gas is introduced before emission of the flash of light from the flash lamps FL in the first preferred embodiment and the reactive gas is introduced within five seconds after emission of the flash of light in the second preferred embodiment, the reactive gas may be introduced around the semiconductor wafer W at the same time when the flash of light is emitted from the flash lamps FL.

Though thirty flash lamps FL are provided in the lamp house 5 in the above preferred embodiments, the number of flash lamps FL is not limited to this but any number of flash lamps FL may be used. Further, the flash lamp FL is not limited to a xenon flash lamp but a krypton flash lamp may be used.

Though preheating of the semiconductor wafer W is performed by heat transfer from the holding part 7 including the hot plate 71 in the above preferred embodiment, there may be a case where a halogen lamp is provided on the bottom of the chamber 6 and preheating of the semiconductor wafer W is performed by emission of light from the halogen lamp.

Further, the technique of the present invention is also effective in activating impurities implanted in an amorphized source/drain region. Specifically, with refinement of patterns, since the source/drain region is amorphized by implanting heavy impurities such as germanium (Ge) or the like in advance, it is absolutely necessary to shallowly implant boron or the like. In such a case, if the impurities for amorphization are implanted after the oxide film is formed, disadvantageously, oxygen enters the source/drain region. If the technique of the present invention is applied to such a case, it is possible to activate the impurities such as boron or the like implanted in the source/drain region and also to form an oxide film (or nitride film) on a surface of the source/drain region, and this prevents corrosion of the source/drain region due to cleaning with liquid medicine.

The technique of the present invention may be also applied to a glass substrate on which a silicon film is formed.

While the invention has been shown and described in detail, the foregoing description is in all aspects illustrative and not restrictive. It is therefore understood that numerous modifications and variations can be devised without departing from the scope of the invention.

What is claimed is:

1. A substrate processing method for processing a semiconductor substrate implanted with impurities, comprising:
    a gas introduction step for introducing a reactive gas that reacts with silicon around a semiconductor substrate implanted with impurities; and
    a light irradiation step for irradiating said semiconductor substrate with light for an irradiation time not shorter than 0.1 milliseconds and not longer than 100 milliseconds to heat said semiconductor substrate, thereby, forming a protection film on a surface of said semiconductor substrate.

2. The substrate processing method according to claim 1, wherein
    said reactive gas is introduced around said semiconductor substrate before said light irradiation step.

3. The substrate processing method according to claim 1, wherein
    said reactive gas is introduced around said semiconductor substrate within five seconds after irradiation of said semiconductor substrate with light.

4. The substrate processing method according to claim 1, wherein
    the atmosphere around said semiconductor substrate is substituted with an inert gas after a lapse of a predetermined time from irradiation of said semiconductor substrate with light.

5. The substrate processing method according to claim 1, wherein
    a surface of said semiconductor substrate is heated to a temperature not lower than 800° C. and not higher than 1300° C. in said light irradiation step.

6. The substrate processing method according to claim 1, wherein
    said semiconductor substrate is cleaned with a cleaning solution after said light irradiation step.

7. The substrate processing method according to claim 1, including:
    removing a film formed on a surface of said semiconductor substrate by reaction with said reactive gas prior to formation of an electrode on said semiconductor substrate.

8. The substrate processing method according to claim 1, wherein
    said reactive gas includes an oxidizing gas that forms an oxide film by reaction with silicon.

9. The substrate processing method according to claim 8, wherein
    the concentration of said oxidizing gas in the atmosphere around said semiconductor substrate ranges from 100 ppm to 10% in said gas introduction step.

10. The substrate processing method according to claim 1, wherein
    said reactive gas includes a nitriding gas that forms a nitride film by reaction with silicon.

* * * * *